United States Patent
Chrisp

[19]

[11] Patent Number: 5,880,834
[45] Date of Patent: Mar. 9, 1999

[54] CONVEX DIFFRACTION GRATING IMAGING SPECTROMETER

[75] Inventor: Michael P. Chrisp, Boulder, Colo.

[73] Assignee: The United States of America as represented by the Administrator of the National Aeronautics and Space Administration, Washington, D.C.

[21] Appl. No.: 47,083

[22] Filed: Mar. 24, 1998

Related U.S. Application Data

[63] Continuation-in-part of Ser. No. 733,751, Oct. 16, 1996, abandoned.

[51] Int. Cl.$^6$ ............................................. G01J 3/18
[52] U.S. Cl. ................................ 356/328; 356/305
[58] Field of Search ............................... 356/305, 326, 356/328, 334

[56] References Cited

FOREIGN PATENT DOCUMENTS 2653879  5/1991  France .................................. 356/305

OTHER PUBLICATIONS

Max Born et al., Principles of Optics, "Electromagnetic Theory of Propagation Interference and Diffraction of Light," Pergamon Press, 1965, pp. 412–415.

Primary Examiner—F. L. Evans
Attorney, Agent, or Firm—John H. Kusmiss

[57] ABSTRACT

A 1:1 Offner mirror system for imaging off-axis objects is modified by replacing a concave spherical primary mirror that is concentric with a convex secondary mirror with two concave spherical mirrors M1 and M2 of the same or different radii positioned with their respective distances d1 and d2 from a concentric convex spherical diffraction grating having its grooves parallel to the entrance slit of the spectrometer which replaces the convex secondary mirror. By adjusting their distances d1 and d2 and their respective angles of reflection α and β, defined as the respective angles between their incident and reflected rays, all aberrations are corrected without the need to increase the spectrometer size for a given entrance slit size to reduce astigmatism, thus allowing the imaging spectrometer volume to be less for a given application than would be possible with conventional imaging spectrometers and still give excellent spatial and spectral imaging of the slit image spectra over the focal plane.

9 Claims, 5 Drawing Sheets

CONVEX DIFFRACTION GRATING IMAGING SPECTROMETER

This application is a continuation-in-part of application Ser. No. 08/733,751, filed on Oct. 16, 1996, now abandoned.

ORIGIN OF THE INVENTION

The invention described herein was made in the performance of work under a NASA contract, and is subject to the provisions of Public Law 96-517 (35 U.S.C. 202) in which the Contractor has elected not to retain title.

TECHNICAL FIELD

The invention relates to a diffraction grating spectrometer and more particularly to an imaging spectrometer based on an Offner 1:1 imaging system for off-axis imaging using concave spherical mirrors facing a convex spherical diffraction grating. This allows for a diffraction grating with high spectral and spatial resolution of the entrance slit which yields high performance when interfacing with a flat solid-state detector array or a flat plate of photographic film at a focal plane.

BACKGROUND ART

There are three problems in designing an imaging spectrometer where light in a slice of an image field passing through an entrance slit is to be diffracted by a grating parallel to the slit and imaged onto a focal plane for display or recording with good spatial resolution parallel to the slit and good spectral resolution perpendicular to the slit:

1. Eliminating astigmatism over the spectrum on the image plane.
2. Removing field curvature from the spectrum focused onto the image plane.
3. Obtaining good spatial resolution of the entrance slit which involves eliminating astigmatism at different field angles from points on the entrance slit.

The third problem is probably the most difficult to accomplish. In conventional imaging spectrometers, the spectrometer size is increased until the astigmatism at different field angles is reduced to an acceptable level. This technique is effective because increasing the spectrometer size for a given slit size reduces the field angle through the spectrometer, leading to a reduction of field aberrations such as astigmatism. But for some applications, such as for aerospace instrumentation, a small design volume is important.

Development of a diffraction grating spectrometer based on an Offner 1:1 imaging system for off-axis objects is reported by Deborah Kwo, George Lawrence and Michael Chrisp, "Design of a grating spectrometer from a 1:1 Offner mirror system," *SPIE*, 818, 275–9 (1987). That grating spectrometer was composed of a large concave spherical mirror facing a concentric convex secondary mirror, both having their center of curvature at the same point on a plane that contains the object (slit) on one side of the convex secondary mirror and an image detector array on a side of the convex secondary mirror opposite the object. The convex secondary mirror was modified by placing a diffraction grating on it with straight grooves perpendicular to the plane of symmetry and parallel to the entrance slit.

With that prior-art design of a reflection grating imaging spectrometer, all third order aberrations were zero leaving only fifth order astigmatism. That astigmatism required slight adjustment of the grating configuration (facilitated by using holographic techniques to produce the grating) and a slight tilt of the convex grating as additional control parameters. However, any tilt of the convex grating destroys the symmetry of the system and introduces coma in the image. Furthermore, only a grating of less than 25 l/mm is possible, thus limiting the upper end of the spectral range.

STATEMENT OF THE INVENTION

A primary objective of this invention is to design an imaging spectrometer that addresses the problems listed above while maintaining a small design volume.

A further objective of the present invention is to provide a convex diffraction grating imaging spectrometer of small volume size based on the 1:1 Offner mirror system, but with a well corrected, spectrally dispersed image of the entrance slit over a wide spectral range.

In accordance with one embodiment of the invention, an aberration free convex reflection grating imaging spectrometer includes a spherical convex diffraction grating and two concave spherical mirrors (M1, M2) positioned on opposite sides of the spherical convex grating in a plane that includes the axis of the spherical convex grating and the centers of both an entrance slit and focal plane array as well as the centers of curvature of the off-axis spherical concave mirrors M1 and M2 so placed and oriented relative to the convex grating as to have different distances d1 and d2, respectively, from their centers to the center of the convex grating such that d1>d2.

The first concave spherical mirror M1 is oriented to receive rays of the image slice entering the slit in a direction parallel to the axis of the spherical convex grating and to reflect the rays onto the convex grating. The second concave spherical mirror is oriented to receive the diffracted rays from the concave grating and to reflect the diffracted rays onto a focal plane in a direction parallel to the axis of the convex spherical grating. In this embodiment, the two concave spherical mirrors have the same radius (R1=R2) but, for better performance, the radii of the concave spherical mirrors are selected independently such that R1≠R2.

In the first embodiment, where the radii of both concave spherical mirrors M1 and M2 are chosen to be the same, to correct for change in astigmatism of the convex grating as a function of spectral wavelength at the convex spherical grating, the two concave mirrors are independently positioned about their center of curvature for best performance, thus adjusting their reflection angles $\alpha$ and $\beta$ and distances d1 and d2 such that d1>d2. In this case of R1=R2, it would be possible and within the scope of this invention to fabricate both mirrors M1 and M2 as a unitary part of one large concave spherical mirror and to then make any fine adjustment that may be required to correct for aberrations by adjustment of the distances d1 and d2. The performance of this option would not be as good, but may be chosen when cost is a deciding factor. Therefore, it is to be understood that in the broadest aspects of the invention as claimed, the requirement for two concave spherical mirrors M1 and M2 may be satisfied with the provision of one large spherical mirror unless the claim requires independent positioning of the two mirrors about their common center of curvature.

In the second embodiment of the invention, the radii of curvature of the concave spherical mirrors are selected independently to be approximately equal to twice the radius of curvature of the convex diffraction grating times cos ($\alpha$/2) for the first concave spherical mirror and times cos ($\beta$/2) for the second concave spherical mirror, where $\alpha$ and $\beta$ are the reflection angles independently set between incident and reflected rays at the centers of the concave mirrors for optimum correction of aberrations with α>β.

A major feature of the present invention is its spatial resolution achieved by empirical selection through the use of a computer raytracing program of a number of parameters that yield optimum performance, namely reflection angles α and β, distances d1 and d2, and radii R1 and R2 of two primary concave spherical mirrors having the same center of curvature as the secondary convex spherical grating. The spatial positions of finite portions of an image field passing through the horizontal entrance slit are maintained through the convex spherical reflection grating spectrometer with high resolutions as each horizontal finite portion produces a vertical spectrum in a different spatial position. This allows simultaneous spectral monitoring across a horizontal slice of a two-dimensional image field. Correlation of the spectra with the two-dimensional image field can then be facilitated by means for simultaneously recording the spectra and the two-dimensional image.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 5a illustrates diagrammatically an isometric view of a camera with a convex spherical grating imaging spectrometer of the present invention with a single active pixel array chip by using two distinct portions for both photographic imaging and spectrum imaging on the same focal plane, and FIG. 5b illustrates a layout for the two distinct portions of the single pixel array of FIG. 5a.

DETAILED DESCRIPTION OF THE INVENTION

Figure 1A:
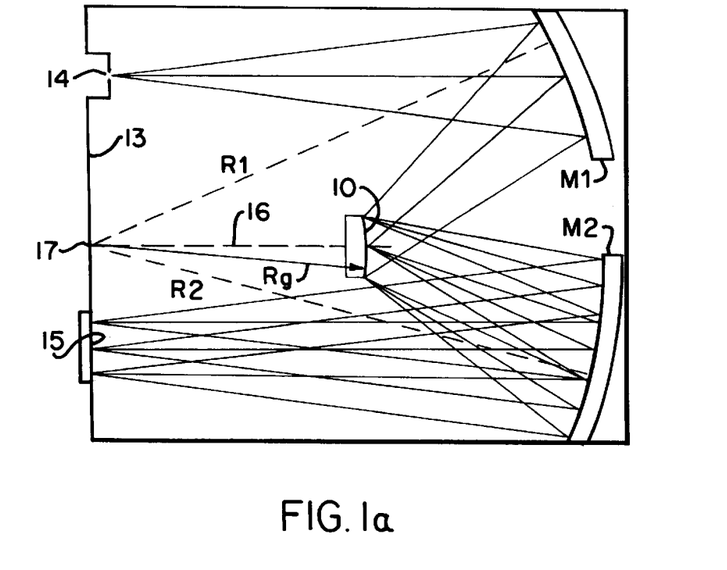
FIG. 1a is a diagrammatic side view of a first embodiment of a convex spherical grating imaging spectrometer in accordance with the present invention.
Figure 1B:
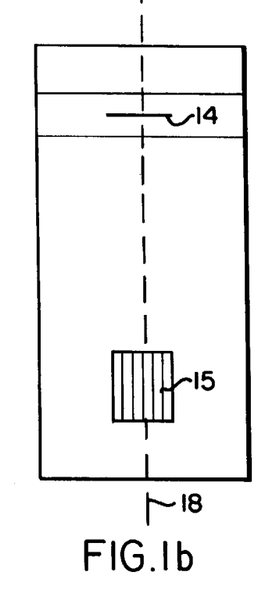
FIG. 1b is a slit-end view of the spectrometer.

Referring to FIGS. 1a and 1b, the imaging spectrometer of the present invention is based upon a convex spherical reflection grating 10 and two separate concave spherical mirrors M1 and M2 shown diagrammatically in a small (9.14×7.62×3.56 cm$^3$) camera box 13 with a 10 mm entrance slit 14 and a focal plane 15 for a solid-state pixel array or photographic film plate on which vertical spectra are projected with a high degree of horizontal spatial resolution of spectra in vertical stripes from a horizontal slice of an image field entering the slit 14. The end view of the box 13 in FIG. 1b shows the position and orientation of the 10 mm slit 14 with respect to the focal plane 15, while FIG. 1a shows the axis 16 of the convex reflection grating 10 perpendicular to a plane that includes the radial center 17 of the convex grating and the focal plane 15. The convex grating 10 has a conventional reflection grating with equispaced grooves. These grooves are perpendicular to the plane of symmetry indicated by a dashed line 18 in FIG. 1b passing through the center of the slit 14 and the focal plane 15, i.e., parallel to the entrance slit 14 centered on that plane of symmetry.

Figure 1C:
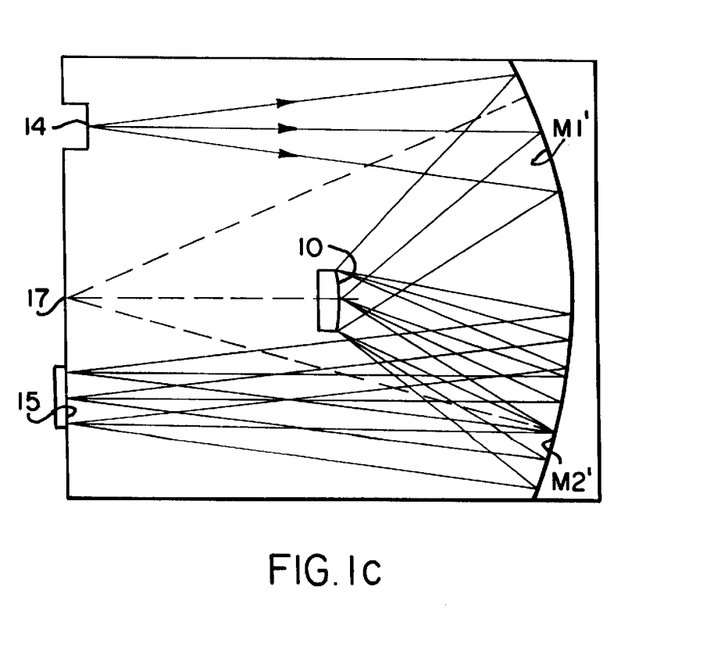
FIG. 1c illustrates a modification of the first embodiment.

The distinguishing characteristic of this imaging spectrometer over the prior-art based on the 1:1 Offner mirror imaging system is the use of separate spherical mirrors M1 and M2, one on each side of the axis 16 of the convex grating 10. In this special case illustrated in FIG. 1a of mirrors M1 and M2 having the same radius (R1=R2), an alternative construction is one extended spherical mirror as shown in FIG. 1c to provide two spherical reflection surfaces M1' and M2' spaced a fixed distance apart such that the distances of both surfaces M1' and M2' from the convex grating 10 are adjusted by positioning the slit 14 and the focal plane 15 relative to the center of curvature 17. However, the optimum performance achieved with that single-mirror construction is less than with separate mirrors M1 and M2 so that the position of each may be adjusted separately to empirically set their respective distances d1 and d2 from the convex reflection grating.

In the prior-art convex grating spectrometer of Kwo et al, (supra), using a single concave spherical mirror, the single spherical mirror and convex grating were kept virtually concentric, and to correct for aberrations the axis of the convex grating was tilted slightly, as noted hereinbefore. The imaging spectrometers of FIGS. 1a and 1c require no such tilt of the convex grating. Moreover, that prior-art convex grating spectrometer required additional aberration control provided by using a special holographic optical element, i.e., a diffraction grating constructed holographically to add aberration compensation by recording the interference patterns of two wavefronts coming from two point sources so selected as to introduce in the grating aberration controlling optics.

The first embodiment of the invention illustrated in FIGS. 1a and 1b provides excellent performance without the need of a specially constructed holographic optical element. Even with a tilt of the special holographic optical element, the performance of the prior-art design versus design size was nowhere near the performance of the first embodiment of this new convex reflection grating design described with reference to FIGS. 1a, 1b and 1c. A further design described below with reference to FIG. 2 has even better performance. All of these new designs can be made with a smaller volume than the prior-art convex grating spectrometer requiring a special holographic optical element.

Figure 2:
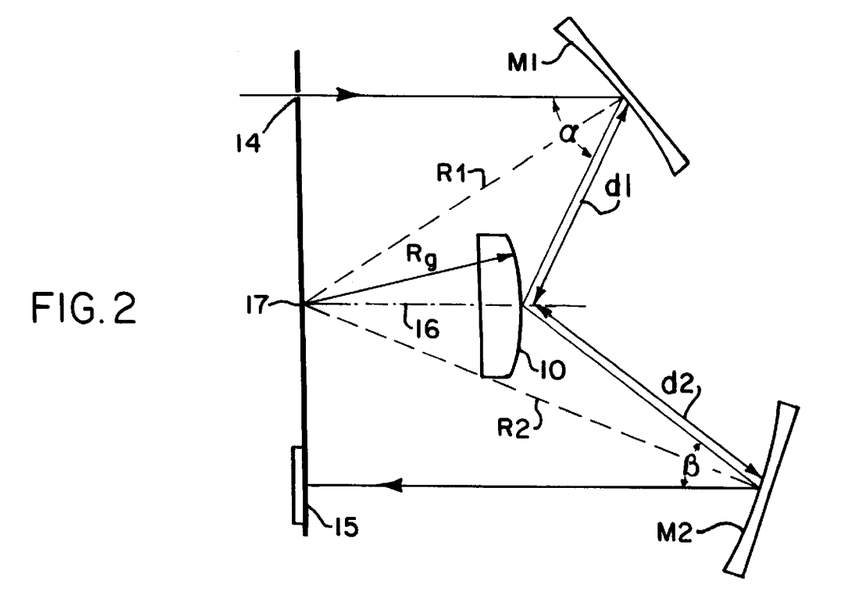
FIG. 2 illustrates a second embodiment of a convex spherical grating imaging spectrometer.

In the embodiment of FIG. 2, additional parameters are made adjustable, namely the radii R1 and R2, in order to provide for a higher degree of aberration correction than the embodiment of FIG. 1a. As in the case of the first embodiment, the design has a plane of symmetry which is in the plane of the paper when looking at FIG. 2. The centers of the slit 14 and focal plane 15 and the centers of curvature of the spherical elements 10, M1 and M2 all lie in this plane. The center of the entrance slit 14 may also lie in the same plane as the focal plane 15 which is one of the advantages of making the radius R1 of the spherical mirror M1 less than the radius R2 of the spherical mirror M2.

The design parameters for the convex grating spectrometer configurations shown in FIGS. 1a, 1c and 2 are summarized as follows:

Two separate mirrors with the same radii of curvature (R1=R2)—FIG. 1a, 1b

Radius R1 of curvature of mirror M1<2×radius of curvature of grating ×cos ($\alpha/2$), where $\alpha$ is the angle included between incident rays and reflected rays of mirror M1.

Radius R2 of curvature of mirror M2>2×radius of curvature of grating ×cos ($\beta/2$), where $\beta$ is the angle included between incident rays and reflected rays of mirror M2.

Distance d1=radius of curvature of grating $R_g$.

Distance d2=radius of curvature of grating $R_g$.

Distance d1>d2.

A single mirror configuration (R1=R2)—FIG. 1c, 1b

Distance d1=radius of curvature of grating $R_g$.

Distance d2<radius of curvature of grating $R_g$.

Distance d1>d2.

Two separate mirrors with different radii of curvature (R1≠R2)—FIG. 2

Radius R1 of curvature of mirror M1=2×radius of curvature of grating×cos ($\alpha/2$), where $\alpha$ is the angle included between incident rays and reflected rays of mirror M1.

Radius R2 of curvature of mirror M2=2×radius of curvature of grating×cos ($\beta/2$), where $\beta$ is the angle included between incident rays and reflected rays of mirror M2.

Distance d1=radius of curvature of grating $R_g$.

Distance d2=radius of curvature of grating $R_g$.

Distance d1<d2.

In the first case, the radii R1 and R2 of the respective mirrors M1 and M2 are equal and approximately equal to twice the radius of curvature of the convex spherical grating 10 times $\cos(\alpha/2)$ for the spherical mirror M1 or M1' and times cos ($\beta/2$) for the spherical mirror M2 or M2'. In the second case R1=R2 because there is a single mirror. In that case, aberration compensation achieved is less than can be achieved with independently positioned mirrors. In the third case of R1≠R2, since the spherical mirrors M1 and M2 may have a different radii, the angles $\alpha$ and $\beta$ included between incident and reflected rays and the distances d1 and d2 from the center of the convex reflection grating 10 of the respective mirrors M1 and M2 may all be adjusted independently for optimum performance. Thus, in the first case of R1=R2, distances d1 and d2 can be adjusted independently as the spherical mirrors M1 and M2 are independently positioned for optimum aberration compensation. The parameters that can be adjusted for compensation of aberration are thus the angles $\alpha$ and $\beta$ and the distances d1 and d2. In the second case of R1=R2 both the angles $\alpha$ and $\beta$ and the distances d1 and d2 vary as a function of the of the slit 14 and the focal plane positions 15 relative to the radial center 17. While good performance is achieved by this second case, it is not as good as in the first case, and neither is as good as in the third case (R1≠R2) shown in FIG. 2, where aberration compensation is again made in the adjustment of the reflection angles $\alpha$ and $\beta$ included between incident and reflected rays of the two mirrors and the distances d1 and d2 in conjunction with independent adjustment of the radii of curvature of the mirrors M1 and M2 for best performance.

In all cases, the radii of curvature R1 and R2 are based on having corresponding Rowland circles for the mirrors M1 and M2 and convex grating 10 coinciding at the radial center 17 of the convex grating. This ensures that light from the slit 14 is focused onto the focal plane 15. The "Rowland circle," first described by H. A. Rowland, Phil. Mag. 13, 469 (1882), is a circle with a radius of curvature that is half the radius of the corresponding mirror. It defines the conjugate meridional focus positions for sources which are on the circumference of the circle.

Figure 1D:
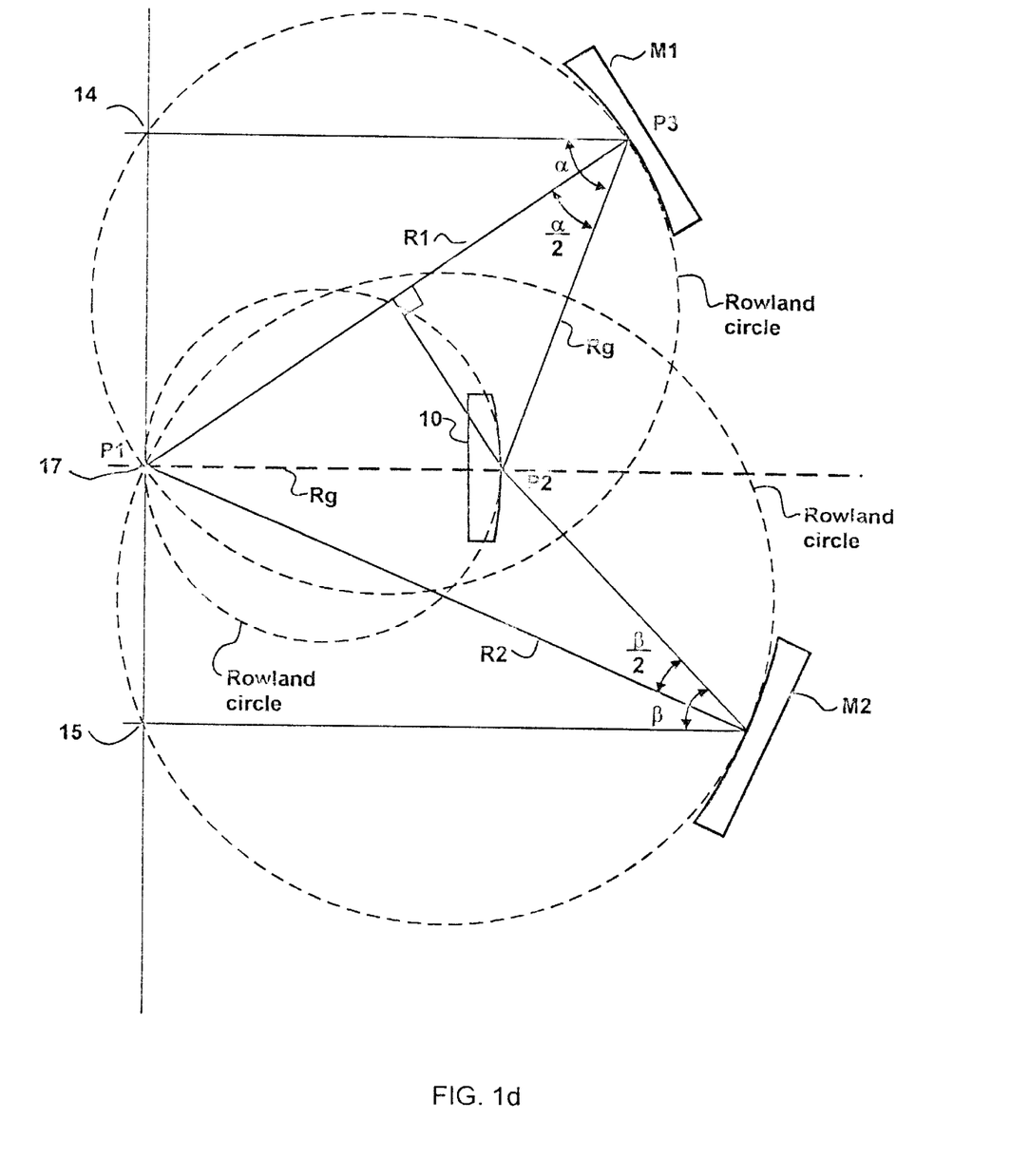
FIG. 1d is a diagram of Rowland circles used for determining the approximate radii of curvature R1 and R2 of the mirrors, not only for the special case of R1=R2 where two of the three circles having those radii would be similar with the mirrors independently positioned to adjust distances d1 and d2 to provide a higher degree of aberration correction but also for the case of R1≠R2 as illustrated in FIG. 2 for correction of aberration.

Thus, as shown in FIG. 1d, which illustrates the Rowland circles used for the present invention in an example of the case R1≠R2, the radius R1 of curvature of the mirror M1 from the radial center 17 of the convex grating 10 to the center of the mirror M1 is virtually twice the radius of the Rowland circle passing through that radial center 17 and the center of the mirror M1. The radius of curvature for the mirror R1 can thus be derived from the condition of having three Rowland circles coincide at the radial center 17 of the convex grating 10.

Note that the radius R1 is one side of the isosceles triangle P1, P2, P3, i.e., the base P1–P3 is the radius R1 of the mirror M1 that bisects the angle $\alpha$. Upon drawing a line perpendicular to the base P1–P3 and through the point P2 a right triangle is formed from which the radius R1 of mirror M1 may be determined.

$\cos (\alpha/2)=R1/2Rg$ $R1=2Rg \cos (\alpha/2)$

A similar derivation for the radius R2 will show that it is equal to $2Rg \cos (\beta/2)$, although because the mirror M2 is further away from the radial center, the angle $\beta$ is not bisected and instead is slightly less than half the angle $\beta$. Consequently, the radius $R2=2Rg \cos (\beta/2)$ is only a good approximation. Therefore, after setting the radius R2 of the mirror M2 at that calculated dimension, the position of that mirror should be adjusted for optimum performance.

The new designs of a convex reflection grating imaging spectrometer described above with reference to FIGS. 1a, 1c and 2 provide for a system capable of being adjusted for optimum performance, i.e., in virtually providing anastigmatic performance over the focal plane with cancellation of the defocus aberrations W020, W200 and the coma aberrations W120, W300, (terms defined by the present inventor, Michael P. Chrisp, in "*Aberrations of Holographic toroidal grating Systems*," Applied Optics, 22, 1508–18 (1983) which by this reference are incorporated herein).

All of the parameters that may be adjusted are best chosen for optimum performance by using a computer aided design (CAD) program, such as CODE V for ray tracing, before fabricating the two concave spherical mirrors M1' and M2' or the single spherical mirror having the necessary reflection areas M1' and M2' The fabricated system with those parameters will have optimum performance and virtually anastigmatic performance over the focal plane with cancellation of in-plane defocus aberrations and inplane coma aberrations.

FIG. 1a gives the typical raytraced performance of this new convex grating design for an f/4 system fitting inside a 9.14×7.62×3.5 cm$^3$ box. The maximum geometric spot size is 10 microns (90% encircled energy) over a 9×10 mm$^2$ focal-plane array. The spatial and spectral resolution exceed those that can be obtained from any of the prior-art designs. The spectral slit curvature is negligible (<2 microns) over the full slit length (10 mm). This is extremely important for spectral instrument calibration and none of the existing conventional designs have spectral slit curvatures as small as this for a given design size and slit length.

A major aerospace application of this new convex grating imaging spectrometer is in imaging remote sensing systems because it would lead to a size reduction in imaging spectrometers by a factor of 3, enabling them to be flown on smaller launch vehicles. The actual size of the spectrometer portion of an imaging spectrometer is determined from the field of view it must accommodate.

For some instruments, a large spectrometer is used because of the large field of view, but the conventional technique of increasing the spectrometer size to decrease its aberrations by reducing the angle of the light rays through it only makes such a large spectrometer larger. Using the new convex grating imaging spectrometer which inherently has wide field of view, the spectrometer can be made smaller by a factor of 5 for the same application.

For imaging spectrometer applications (where the entrance slit is imaged at different spectral wavelengths onto the focal plane), this new convex grating imaging spectrometer has better performance than prior-art reflecting spectrometers. The new convex grating imaging spectrometer has outstanding image quality because it has good correction of astigmatism and field curvature over the image area. In conventional imaging spectrometers, correcting astigmatism and field curvature over the image area are extremely difficult to accomplish.

Figure 3:
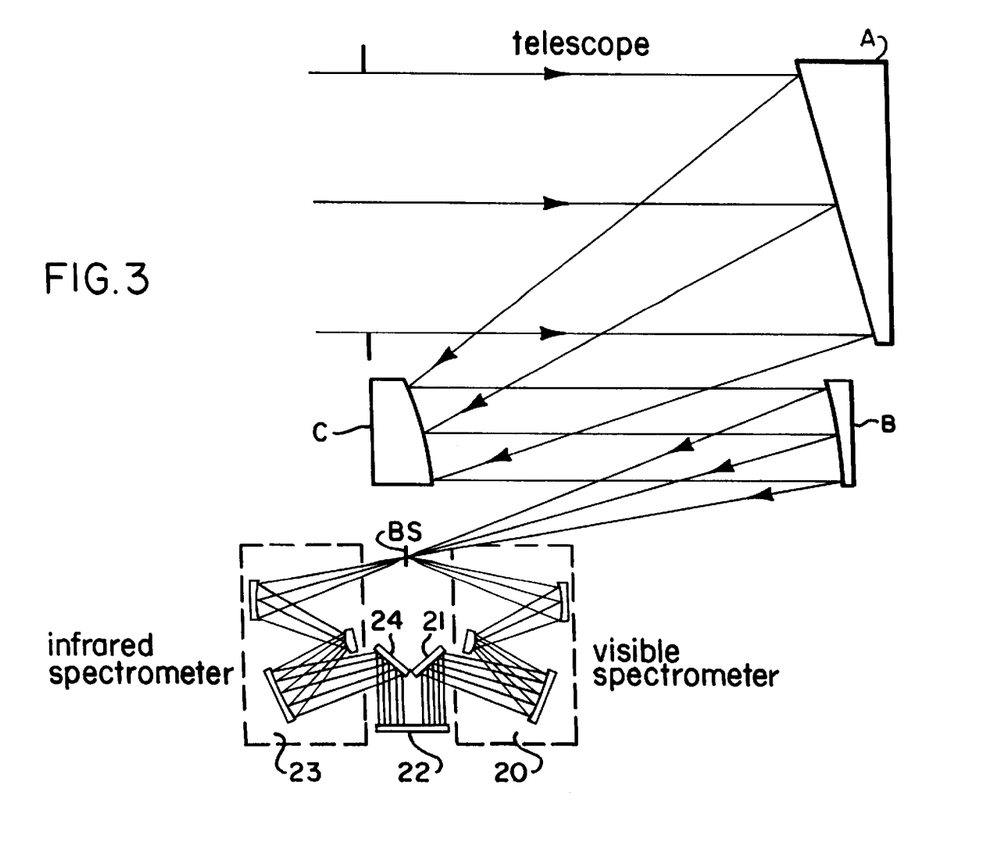
FIG. 3 illustrates diagrammatically an arrangement of optical elements for both infrared and visible convex spherical grating imaging spectrometers in accordance the present invention.

FIG. 3 is a diagram for an imaging spectrometer for aerospace applications based on the new convex grating imaging spectrometer disclosed herein. The instrument consists of three telescopic optical elements A, B and C to gather visible and IR radiation and a beamsplitter BS for separating the visible spectrum from the IR spectrum. A new convex grating imaging spectrometer 20 comprising two spherical mirrors and a convex spherical reflection grating arranged as shown in FIG. 1a or FIG. 2 receives the radiation reflected by the beamsplitter to produce a visible spectrum that is reflected by a flat mirror 21 onto one section of a focal-plane pixel sensor array 22. The IR radiation transmitted through the beamsplitter BS is received by a similarly designed convex spherical reflection grating spectrometer 23 which differs primarily in the spacing of the grooves. The IR spectrum is reflected by a flat mirror 24 onto a second section of the focal-plane pixel sensor array 22. In the focal-plane array 22, semiconductor material that is sensitive to the radiation band of interest is selected for each section of the pixel sensor array 22. Thus, the aerospace imaging spectrometer design of FIG. 3 based on the new convex spherical reflection grating spectrometer may be readily used for a small earth explorer mission.

Figure 4:
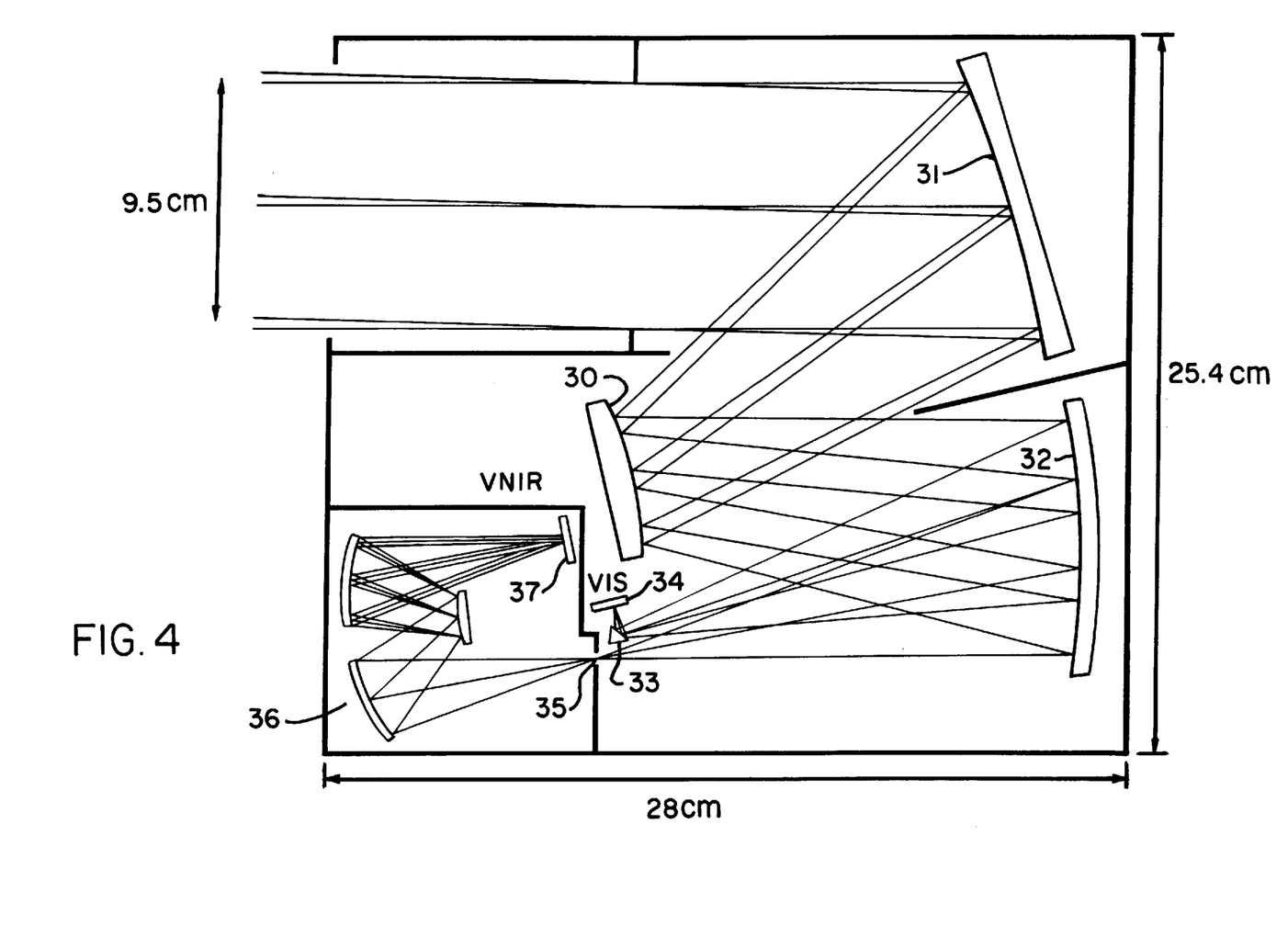
FIG. 4 illustrates schematically an oceanographic convex spherical grating imaging spectrometer of the present invention for near infrared and visible wavelengths.

FIG. 4 is a diagram of a comparable convex grating imaging spectrometer (f/2.8) for use with oceanographic imaging. Here the light gathered by the three mirrors 30, 31 and 32 of an astigmatic telescope is focused via a reflecting element 33 onto a visible focal plane array 34 for recording and directly to a spectrometer slit 35. The visible image (VIS) is reflected by a prism 33 onto a focal-plane array 34 for recording while the near infrared radiation spectra (VNIR) passes through the slit 35 into a convex reflection grating imaging spectrometer 36 for producing VNIR spectra for recording at a focal plane 37.

Figures 5A, 5B:
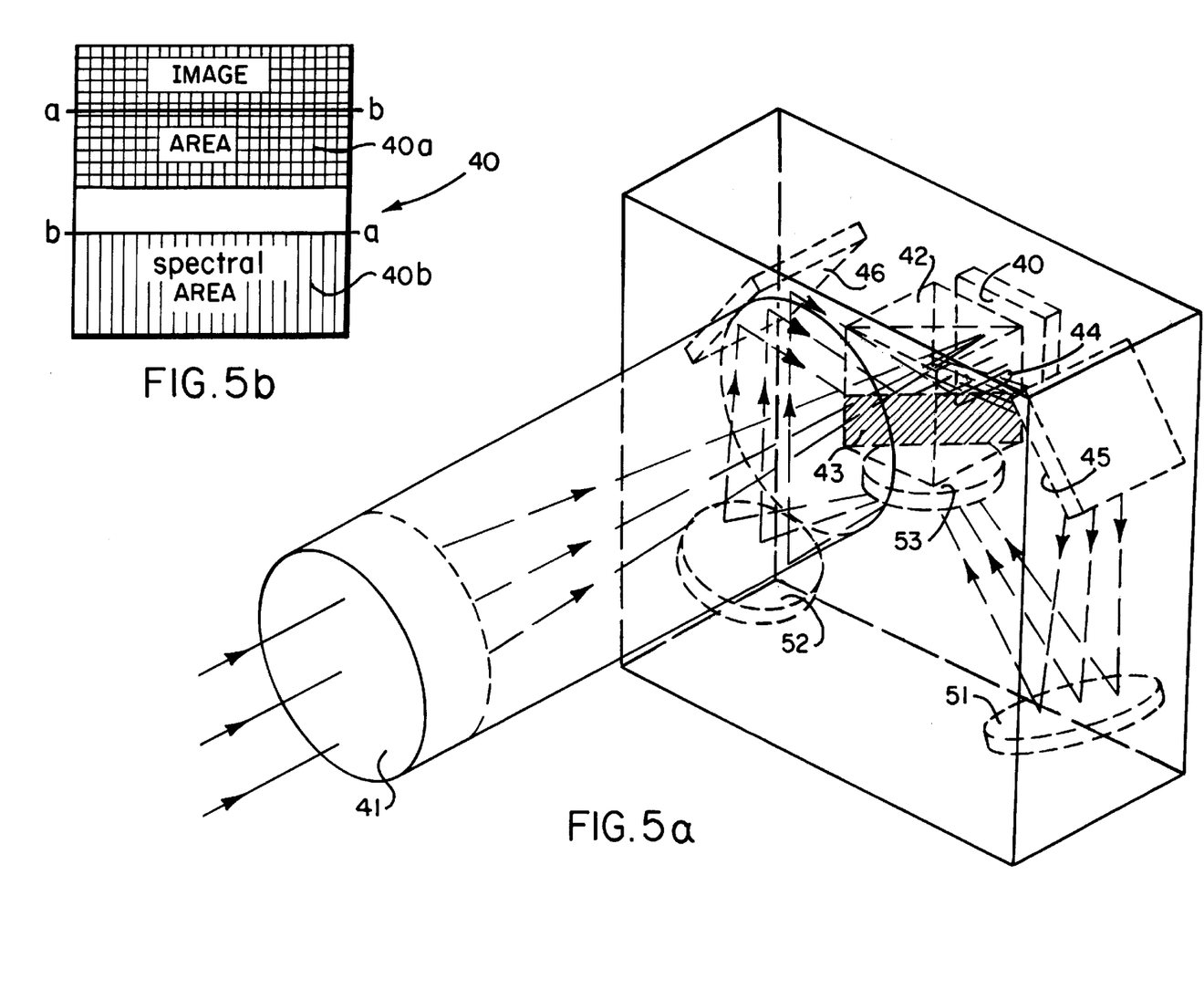

FIG. 5a illustrates in an isometric view the optical layout of a photographic camera combined with a convex reflection grating imaging spectrometer implemented in accordance with the present invention. The camera portion utilizes a single focal plane pixel array chip 40 shown in FIG. 5b for both photographic imaging in an area 40a and convex reflection grating imaging in an area 40b using a spectrometer similar to that in FIG. 1a or FIG. 2 miniaturized (4×4×1.5 cm³) by a factor of 10 vis-à-vis prior-art spectrometer designs based upon the 1:1 Offner mirror. A lens system 41 forms a telecentric image, thus positioning the pupil image in the imaging spectrometer without the need for additional field lenses. A beamsplitting cube 42 has a metallic coating 43 along the bottom third portion of the diagonal interface between two opposite corners of the cube for reflection of spectral output rays onto the spectral area 40b of the pixel array chip 40. Part of the pupil image light that passes over the metallic coating 43 of the beamsplitting cube 42 is recorded on the image area 40a of the focal-plane pixel sensor array 40 to present an image of the scene. It should be noted that the spectrometer portion of the camera reverses the light from the scene such that the spectral arrays of corresponding points along the line a–b in FIG. 5a of the image scene are in inverse order b–a of the spectral arrays as shown in FIG. 5b.

The part of the image light reflected by the top two-third portion of the cube 42 is passed through an entrance slit 44 in front of the face of a mirror 45 to select a slice of the image being recorded along the line a–b in FIG. 5a. That slit may be formed on the face of the beamsplitting cube 42 by a blocking film (not shown) having a slit cut in it horizontal to the base of the camera. The light passing through that slit is then folded down by the mirror 45 to pass through the convex reflector grating imaging spectrometer comprising concave spherical mirrors 51 and 52 and a convex grating 53 which disperses and focuses the light as in FIG. 1a or FIG. 2. This dispersed and focused light is then returned by a folding mirror 46 along a path lower down on the other side of the beamsplitting cube 42 where the metallic coating 43 totally reflects the spectrally dispersed slice of light onto the spectral area 40b of the focal-plane pixel array 40 shown in FIG. 5b. Note that there is approximately 2 mm of dead space between the image area 40a and the spectral area 40b of the focal-plane pixel array 40.

As noted above, the image slice taken from the image field by the entrance slit 44 (indicated by a line a–b in the image area of the pixel array 40) is spatially reversed in the spectral area 40b of the pixel array as indicated by the designation b–a at the upper corners of the spectral area. The spectrum for each horizontal portion of the image slice is recorded with a high degree of spectral resolution in a separate vertical linear array (strip) of pixels with a high degree of spatial resolution. An order sorting filter (not shown) may be placed over the 800 to 1000 nm spectral area 40b of the focal-plane pixel sensor array 40 to prevent recording of any overlapping second order from the convex reflection grating imaging spectrometer. A nice feature of this new convex reflection grating imaging spectrometer is that the image slice taken by the entrance slit 44 is registered on the area 40a focal-plane pixel sensor array 40 with the spectral image on the area 40b as shown in FIG. 5b, thus leaving no possibility for misregistration between the spectral image data and the scene image. For building up a spectral image over a complete scene, the entire imaging spectrometer camera may be scanned across the scene by a stepper motor. Good registration of spectral image data recorded for each scene image recorded allows for later correlating the spectral data with panchromatic frames taken every so often to facilitate spectral image data logging and correlation over the complete scene.

A major application for spherical convex reflection grating spectrometers of the present invention is in fiber multistripe spectroscopy wherein a number of fibers from different monitoring stations are positioned in a linear array along the length of the entrance slit of the spectrometer. Each fiber produces a spectrum in a different spatial position on the two-dimensional detector array. Note that the spatial positions are indicated by the horizontal array of vertical stripes of the focal plane array in FIG. 16 while the spectra are recorded along the separate vertical stripes. These spectra remain separate because of the spatial resolution of this new spherical convex reflection grating spectrometer. The spatial and spectral arrangement also indicated in FIG. 1a holds for all embodiments of the invention, hence the term "convex reflection grating imaging spectrometer." This feature allows simultaneous spectral monitoring currently being used in multipoint process control, liquid chromatography and emission spectroscopy. Other applications will occur to one skilled in the art, such as multiple blood sample analysis.

Although particular embodiments of the invention have been described and illustrated herein, it is recognized that modifications may readily occur to those skilled in the art. Consequently, it is intended that the claims be interpreted to cover such modifications and equivalents thereof.

What is claimed is:

1. A convex spherical diffraction grating imaging spectrometer comprising a convex spherical diffraction grating having a fixed radius of curvature and an axis perpendicular to a plane from which radiation may be received through an off-axis entrance slit, said grating having equally spaced parallel grooves oriented parallel to said slit, a first concave spherical mirror positioned to reflect radiation from said off-axis slit to said spherical convex diffraction grating, said first concave spherical mirror being oriented to reflect rays of radiation to said convex spherical diffraction grating with an angle ($\alpha$) between incident rays and reflected rays, said first concave spherical mirror having a radius of curvature that is approximately double said fixed radius of curvature of said spherical convex diffraction grating times cos ($\alpha/2$), a second concave spherical mirror positioned to reflect radiation from said convex spherical diffraction grating to a focal plane parallel to said plane of said entrance slit, said second concave spherical mirror being positioned on a side of said convex spherical diffraction grating opposite said first concave spherical mirror and oriented to reflect rays of radiation to said focal plane at an angle ($\beta$) between incident rays from said convex spherical grating and reflected rays to said focal plane, said second concave spherical mirror having a radius of curvature that is about double said radius of curvature of said spherical convex diffraction grating times cos ($\beta/2$), said first and second concave spherical mirrors each being positioned away from said convex spherical diffraction grating a distance approximately equal to said radius of curvature of said convex spherical reflection grating with their centers in a plane of symmetry that includes the centers of said convex spherical diffraction grating, said entrance slit and said focal plane, and means at said focal plane for recording a spectral image of said entrance slit with excellent spectral resolution in a different spatial position for each separate lateral point of said entrance slit.

2. A convex spherical diffraction grating imaging spectrometer as defined in claim 1 wherein said radius of curvature of said first concave spherical mirror is equal to said radius of curvature of said second concave spherical mirror, and a distance of said first concave spherical mirror to said convex spherical diffraction grating is greater than a distance of said second concave spherical mirror to said convex spherical diffraction grating.

3. A convex spherical diffraction grating imaging spectrometer as defined in claim 2 wherein said first and second spherical mirrors are an integral part of a mirror sufficiently large to include as portions thereof said first and second concave mirrors spaced apart.

4. A convex spherical diffraction grating imaging spectrometer as defined in claim 1 wherein said radius of curvature of said first concave spherical mirror is less than said radius of curvature of said second concave spherical mirror, and a distance of said first concave spherical mirror to said convex spherical diffraction grating is less than a distance of said second concave spherical mirror to said convex spherical diffraction grating.

5. A convex spherical diffraction grating imaging spectrometer based on a 1:1 Offner mirror system for imaging spectra of off-axis images through an entrance slit, comprising concave spherical mirrors (M1) and (M2) positioned at respective distances (d1) and (d2) from a concentric convex spherical diffraction grating having grating grooves parallel to an entrance slit with respective angles of reflection ($\alpha$) and ($\beta$), said angles of reflection being defined as the angles between their respective incident and reflected rays, thereby to provide optimum correction of all aberrations including astigmatism with excellent spatial and spectral resolution of said entrance slit image spectra on a focal plane parallel to a plane from which radiation is received through said entrance slit, wherein said distance (d1) and angle of reflection ($\alpha$) of said concave spherical mirror (M1) from said concentric convex spherical diffraction grating are greater than said distance (d2) and angle of reflection ($\beta$) of said concave spherical mirror (M2) from said concentric convex spherical diffraction grating.

6. A convex spherical diffraction grating imaging spectrometer as defined in claim 5 wherein said two concave spherical mirrors (M1) and (M2) are integral parts of a larger concave spherical mirror.

7. A convex spherical diffraction grating imaging spectrometer based on a 1:1 Offner mirror system for imaging spectra of off-axis images through an entrance slit, comprising concave spherical mirrors (M1) and (M2) positioned at respective distances (d1) and (d2) from a concentric convex spherical diffraction grating having grating grooves parallel to an entrance slit with respective angles of reflection ($\alpha$) and ($\beta$), said angles of reflection being defined as the angles between their respective incident and reflected rays, thereby to provide optimum correction of all aberrations including astigmatism with excellent spatial and spectral resolution of said entrance slit image spectra on a focal plane parallel to a plane from which radiation is received through said entrance slit, wherein radii R1 and R2 of said concave spherical mirrors M1 and M2 are equal.

8. A convex spherical diffraction grating imaging spectrometer based on a 1:1 Offner mirror system for imaging spectra of off-axis images through an entrance slit, comprising concave spherical mirrors (M1) and (M2) positioned at respective distances (d1) and (d2) from a concentric convex spherical diffraction grating having grating grooves parallel to an entrance slit with respective angles of reflection ($\alpha$) and ($\beta$), said angles of reflection being defined as the angles between their respective incident and reflected rays, thereby to provide optimum correction of all aberrations including astigmatism with excellent spatial and spectral resolution of said entrance slit image spectra on a focal plane parallel to a plane from which radiation is received through said entrance slit, wherein radii (R1) and (R2) of said concave spherical mirrors (M1) and (M2) are selected to be different for optimum spatial and spectral resolution of said spectra imaged through said slit.

9. A convex spherical diffraction grating imaging spectrometer as defined in claim 8 wherein the radius (R1) of said first concave spherical mirror (M1) is greater than the radius (R2) of said second concave spherical mirror (M2)

and said distance (d1) of said first concave spherical mirror (M) from said convex spherical diffraction grating is less than said distance (d2) of said second concave spherical mirror M2) from said convex spherical diffraction grating.

* * * * *